(12) United States Patent
Han

(10) Patent No.: US 11,380,844 B2
(45) Date of Patent: Jul. 5, 2022

(54) SEMICONDUCTOR DEVICE INCLUDING VARIABLE RESISTANCE ELEMENT

(71) Applicant: SK hynix Inc., Icheon-si (KR)

(72) Inventor: Jae-Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/338,556

(22) Filed: Jun. 3, 2021

(65) Prior Publication Data

US 2021/0296581 A1 Sep. 23, 2021

Related U.S. Application Data

(62) Division of application No. 16/868,429, filed on May 6, 2020, now Pat. No. 11,056,648.

(30) Foreign Application Priority Data

Dec. 12, 2019 (KR) ......................... 10-2019-0165406

(51) Int. Cl.
*H01L 45/00* (2006.01)
*G11C 13/00* (2006.01)
(Continued)

(52) U.S. Cl.
CPC ......... *H01L 45/1206* (2013.01); *G06N 3/063* (2013.01); *G11C 13/004* (2013.01); *G11C 13/0011* (2013.01); *G11C 13/0069* (2013.01); *H01L 27/2409* (2013.01); *H01L 27/2463* (2013.01); *H01L 45/085* (2013.01); *H01L 45/1266* (2013.01); *G11C 2013/005* (2013.01); *G11C 2013/0045* (2013.01); *G11C 2013/0071* (2013.01); *G11C 2213/72* (2013.01)

(58) Field of Classification Search
CPC ............... H01L 45/1206; H01L 45/085; H01L 27/2409; H01L 27/2463; H01L 45/1266; G06N 3/063; G11C 13/0069; G11C 13/004; G11C 13/0011; G11C 2013/005; G11C 2013/0071; G11C 2013/0045; G11C 2213/72
See application file for complete search history.

(56) References Cited

U.S. PATENT DOCUMENTS 7,582,926 B2 * 9/2009 Iwata .................. H01L 27/1203
257/E27.005
7,791,925 B2 9/2010 Li
(Continued)

FOREIGN PATENT DOCUMENTS

KR 10-2013-0111286 A 10/2013

*Primary Examiner* — Tri M Hoang

(57) ABSTRACT

A semiconductor device including at least one variable resistance device is provided. A variable resistance element includes: an ion supply layer having a top, a bottom and a sidewall connecting the top to the bottom; an ion-receiving layer having an inner sidewall connected to at least a portion of the sidewall of the ion supply layer; a gate pattern connected to an outer sidewall of the ion-receiving layer; and a source pattern connected to one of the top or bottom of the ion supply layer, and a drain pattern connected to the other one or the top or bottom of the ion supply layer. A resistance of the ion supply layer is varies depending on an amount of ions supplied from the ion supply layer to the ion-receiving layer in response to a voltage applied to the gate pattern.

14 Claims, 12 Drawing Sheets

(51) Int. Cl.
*H01L 27/24* (2006.01)
*G06N 3/063* (2006.01)

(56) References Cited

U.S. PATENT DOCUMENTS

| | | | |
|---|---|---|---|
| 7,960,712 B2 * | 6/2011 | Sakamoto | H01L 45/1233 |
| | | | 257/4 |
| 8,299,571 B2 | 10/2012 | Ozawa | |
| 8,471,233 B2 | 6/2013 | Aozasa | |
| 9,019,769 B2 * | 4/2015 | Lee | G11C 16/0408 |
| | | | 365/185.26 |
| 9,076,723 B1 | 7/2015 | Matsunami et al. | |
| 9,231,193 B2 | 1/2016 | Iwayama | |
| 9,947,685 B2 | 4/2018 | Fujii | |
| 2014/0034891 A1 * | 2/2014 | Wang | H01L 27/2472 |
| | | | 438/238 |
| 2020/0027920 A1 * | 1/2020 | Miura | H01L 43/08 |
| 2020/0388755 A1 | 12/2020 | Chang | |

* cited by examiner

SEMICONDUCTOR DEVICE INCLUDING VARIABLE RESISTANCE ELEMENT

CROSS-REFERENCE TO RELATED APPLICATION

This application a divisional application of a U.S. patent application Ser. No. 16/868,429, filed on May 6, 2020, now U.S. Pat. No. 11,056,648, which claims priority under 35 U.S.C. § 119 to Korean Patent Application No. 10-2019-0165406 filed on Dec. 12, 2019, which is incorporated herein by reference in its entirety.

BACKGROUND

1. Field

Exemplary embodiments of the present disclosure relate to a variable resistance element and a semiconductor device including the same.

2. Discussion of the Related Art

With electronic devices trending toward miniaturization, low power consumption, high performance, diversification, and so on, technology capable of efficiently processing a large amount of information is in demand. In particular, there is a growing interest in neuromorphic technology for mimicking the human nervous system in electronic devices. The human nervous system contains hundreds of billions of neurons and synapses, which are connections between neurons. Neuromorphic technology is intended to realize neuromorphic devices by designing neuron circuits and synaptic circuits that correspond to biological neurons and synapses. The neuromorphic devices may be utilized in various applications including data classification, pattern recognition, and the like.

SUMMARY

Various embodiments are directed to a variable resistance element having a characteristic suitable for use as a synapse in a neuromorphic device, and a semiconductor device including the same.

In an embodiment, a semiconductor device includes at least one variable resistance element, the variable resistance element including: an ion-receiving layer having a top, a bottom and a sidewall connecting the top to the bottom; an ion supply layer having an inner sidewall connected to at least a portion of the sidewall of the ion-receiving layer; a gate pattern connected to an outer sidewall of the ion supply layer; and a source pattern connected to one of the top or bottom of the ion-receiving layer, and a drain pattern connected to the other one of the top or bottom of the ion-receiving layer, wherein a resistance of the ion-receiving layer varies depending on an amount of ions supplied from the ion supply layer based on a voltage applied to the gate pattern.

In another embodiment, a semiconductor device includes at least one variable resistance element, the variable resistance element including: an ion supply layer having a top, a bottom and a sidewall connecting the top to the bottom; an ion-receiving layer having an inner sidewall connected to at least a portion of the sidewall of the ion supply layer; a gate pattern connected to an outer sidewall of the ion-receiving layer; and a source pattern connected to one of the top or bottom of the ion supply layer, and a drain pattern connected to the other one or the top or bottom of the ion supply layer, wherein a resistance of the ion supply layer is varies depending on an amount of ions supplied from the ion supply layer to the ion-receiving layer in response to a voltage applied to the gate pattern.

DETAILED DESCRIPTION

Figure 1:
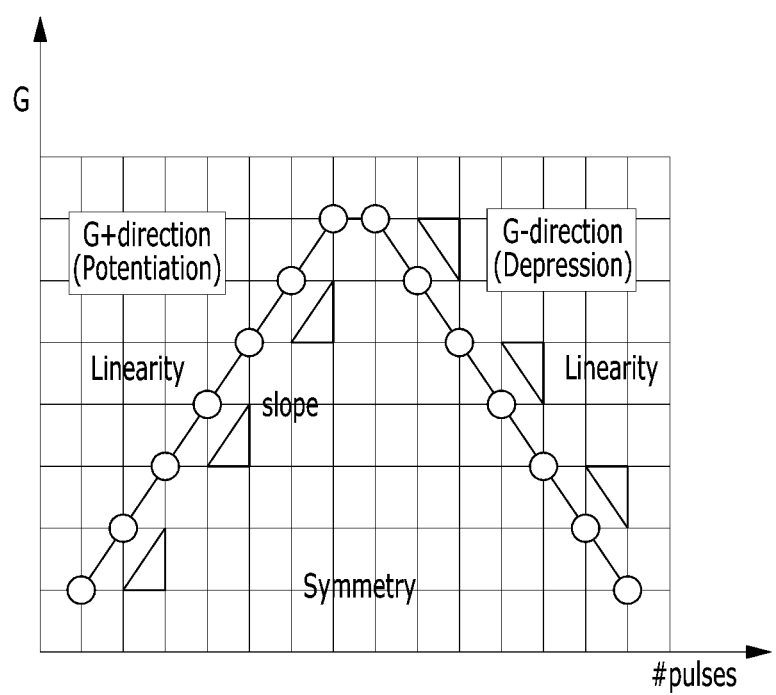
FIG. 1 shows a conductivity of a synapse depending on the number of electrical pulses which are input to the synapse of a neuromorphic device.

Various embodiments will be described below in detail with reference to the accompanying drawings.

The drawings may not be necessarily to scale and in some instances, proportions of at least some of structures in the drawings may have been exaggerated in order to clearly illustrate certain features of the described embodiments. When a multilayer structure is disclosed in a drawing or the detailed description, the relative positioning relationship of such layers or the sequence of arranging the layers as shown reflects a particular implementation for the described or illustrated example, and thus the present disclosure is not limited thereto and the relative positioning relationship or sequence of arranging the layers may be changed. In addition, a described or illustrated example of a multi-layer structure may not reflect all layers present in the particular multilayer structure (e.g., one or more additional layers may be present between two illustrated layers). For example, when a first layer in a described or illustrated multi-layer structure is referred to as being "on" or "over" a second layer or "on" or "over" a substrate, it may not only represent a structure where the first layer may be directly formed on the second layer or the substrate but also represent a structure where one or more other intermediate layers may exist between the first layer and the second layer or between the first layer and the substrate.

Embodiments of the present disclosure are intended to provide a variable resistance element having a characteristic suitable for use as a synapse in a neuromorphic device. However, it is to be understood that variable resistance elements according to embodiments of the present disclosure may be used not only in neuromorphic devices, but also in various semiconductor devices such as memory devices. Before describing variable resistance elements according to embodiments of the present disclosure, characteristics of a device suitable for use as a synapse in a neuromorphic device will be described.

In general, a variable resistance element that is used as a memory element in a memory device may be able to switch between a high-resistance state and a low-resistance state through a set operation and a reset operation. The variable resistance element may preferably have a low-resistance state and a high-resistance state, which are clearly distinguished from each other due to the abrupt resistance change that occurs in the set operation and the reset operation. The variable resistance element may maintain its own resistance state until the set operation and the reset operation are performed, even if electrical pulses are repeatedly applied to the element. The variable resistance element may store different data using these characteristics.

In contrast, a variable resistance element that is used as a synapse in a neuromorphic device preferably does not undergo an abrupt resistance change between the set operation and the reset operation, but instead exhibits analog behavior in which conductivity and/or electrical resistance gradually changes depending on the number of input electrical pulses. This analog behavior improves various operating characteristics of the neuromorphic device, such as increasing the accuracy of learning and recognition. Hereinafter, a more detailed description will be made with reference to FIG. 1.

FIG. 1 shows a conductivity of a synapse depending on the number of electrical pulses which are input to the synapse of a neuromorphic device.

Referring to FIG. 1, when first-polarity voltage pulses, for example, negative voltage pulses that have a voltage equal to or higher than a certain critical value, are repeatedly applied to a synapse that is in a low-resistance state, the electrical conductivity (G) of the synapse may gradually increase. A direction in which the electrical conductivity (G) of the synapse increases may be referred to as a G+ direction or a potentiation direction.

When second-polarity voltage pulses, for example, positive voltage pulses that have a voltage equal to or higher than a reset voltage, are applied to this synapse, a reset operation may be performed in which the resistance state of the synapse changes to a high-resistance state.

When the second-polarity voltage pulses are repeatedly applied to the synapse that is in the high-resistance state, the electrical conductivity (G) of the synapse may gradually decrease. A direction in which the electrical conductivity (G) of the synapse decreases may be referred to as a G− direction or a depression direction.

When first-polarity voltage pulses having a voltage equal to or higher than a set voltage are applied again to the synapse, the set operation may be performed and the resistance state of the synapse changes to the low-resistance state.

It may be preferable that the rate of change of electrical conductivity (G) of the synapse is substantially constant in the potentiation operation and the depression operation, and that the synapse exhibits substantially symmetrical electrical conductivity (G) characteristics around the set or reset points as illustrated in FIG. 1.

In summary, it may be preferable that the electrical conductivity (G) of the synapse is variable gradually, that is, with three or more multiple levels, in comparison to variable resistance elements that abruptly switch between high and low resistance states. The electrical conductivity (G) of the synapse in the potentiation operation and the depression operation may preferably have linearity and symmetry.

Hereinafter, a variable resistance element having a structure suitable for use as a synapse having the above-described characteristics, and a method of operating the variable resistance element, will be described with reference to FIGS. 2A, 2B and 3.

Figure 2A:
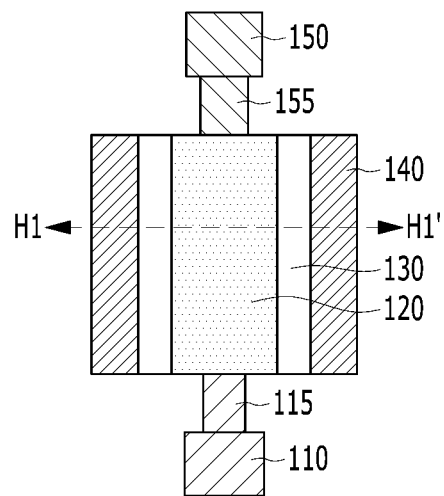
FIGS. 2A and 2B are a sectional view and plan view illustrating a variable resistance element according to an embodiment of the present disclosure.
Figure 2B:
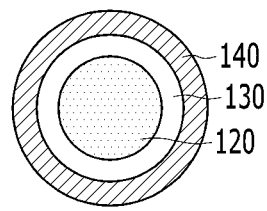

FIGS. 2A and 2B are a sectional view and plan view illustrating a variable resistance element according to an embodiment of the present disclosure. FIG. 2B is a plan view taken along line H1-H1' of FIG. 2A.

Referring to FIGS. 2A and 2B, a variable resistance element according to an embodiment may include: a pillar-shaped ion-receiving layer 120 extending in a vertical direction; an ion supply layer 130 surrounding a sidewall of the ion-receiving layer 120; a gate pattern 140 surrounding a sidewall of the ion supply layer 130; a source pattern 110 connected to a bottom of the ion-receiving layer 120; and a drain pattern 150 connected to a top of the ion-receiving layer 120.

The ion-receiving layer 120 may include a material that may enter an oxygen-deficient state to form oxygen vacancies when receiving cations, particularly metal cations, from the ion supply layer 130. For example, the ion-receiving layer 120 may include at least one of electrolyte materials, electro-chromic materials, lithium (Li)-based oxides, transition metal oxides such as LiPON, $LiCoO_2$, $LiFePO_4$, $LiMn_2O_4$ and $M_2O_x$, perovskite-like materials such as $WO_3$, $MoO_3$ and $SrTiO_3$, and so on. The oxygen vacancies act as donor defects. Thus, as the amount of the oxygen vacancies increases, the electrical conductivity of the ion-receiving layer 120 may increase, and as the amount of the oxygen vacancies decreases, the electrical conductivity of the ion-receiving layer 120 may decrease. That is, the resistance of the ion-receiving layer 120 may be variable depending on the amount of the oxygen vacancies in the ion-receiving layer 120.

The ion supply layer 130 may include a material that supplies cations, particularly metal cations, to the ion-receiving layer 120. For example, the ion supply layer 130 may include at least one of Li-based oxides, transition metal oxides such as LiPON, $LiCoO_2$, $LiFePO_4$, $LiMn_2O_4$ and $M_2O_x$, perovskite-like materials such as $WO_3$, $MoO_3$ and $SrTiO_3$, and so on. In particular, the ion supply layer 130 may be formed of a material different from that of the ion-receiving layer 120, and may include a material having a greater metal ion content than that of the ion-receiving layer 120. In an embodiment, the ion supply layer 130 may have a shape that surrounds the outer sidewall of the ion-receiving layer 120. However, this present disclosure is not limited thereto, and the shape of the ion supply layer 130 may be variously modified such that the ion supply layer 130 is in contact with at least a portion of the sidewall of the ion-receiving layer 120 and provides a smooth or uninterrupted supply of ions to the ion-receiving layer 120.

The gate pattern 140 may function to control ion movement from the ion supply layer 130 to the ion-receiving layer 120 in response to certain received voltages. The gate pattern 140 may include various electrically conductive materials, such as metals, metal nitrides, or combinations thereof. In an embodiment, the gate pattern 140 may have a shape surrounding the outer sidewall of the ion supply layer 130; the inner sidewall of the ion supply layer 130 may mean a sidewall coming in contact with the sidewall of the ion-receiving layer 120, and the outer sidewall of the ion supply layer 130 may mean a sidewall opposite the inner sidewall. However, the present disclosure is not limited thereto, and in other embodiments the shape of the gate pattern 140 may be variously modified so that the gate pattern 140 is in contact with at least a portion of the outer sidewall of the ion supply layer 130 and the gate pattern 140 controls ion movement from the ion supply layer 130 to the ion-receiving layer 120 to allow smooth transitions between a plurality of resistance states.

The source pattern 110 and the drain pattern 150 are connected to the bottom and top of the ion-receiving layer 120, respectively, and a change in the resistance of the ion-receiving layer 120 may be read through these patterns. The source pattern 110 and the drain pattern 150 may include various electrically conductive materials, such as metals, metal nitrides, or combinations thereof. In an embodiment, the source pattern 110 and the drain pattern 150 are shown to have a rectangular sectional shape, but in other embodiments the shape of the drain and source patterns may be variously modified. Source pattern 110 and drain pattern 150 may be connected to the bottom and top of the ion-receiving layer 120 through a source contact 115 and a drain contact 155, respectively. As will be described later, for easy processing and the like, the source contact 115 and the drain contact 155 may be interposed between the source pattern 110 and the ion-receiving layer 120, and between the drain pattern 150 and the ion-receiving layer 120, respectively. The source contact 115 and the drain contact 155 may have a pillar-like shape. However, the present disclosure is not limited thereto, and in other embodiments, the source contact 115 and the drain contact 155 may be omitted, and the source pattern 110 and the drain pattern 150 may directly contact the bottom and top of the ion-receiving layer 120, respectively. In addition, although this embodiment illustrates a case in which the source pattern 110 is positioned below the ion receiving layer 120 and the drain pattern 150 is positioned above the ion-receiving layer 120, in other embodiments positions of the source pattern 110 and the drain pattern 150 may be reversed or positioned relative to each other in different configurations.

A method of operating a variable resistance element described above will be described in detail below with reference to FIG. 3.

Figure 3:
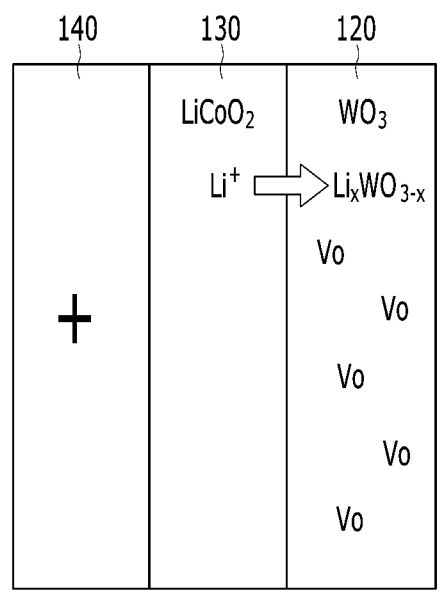
FIG. 3 is a view illustrating a method of operating the variable resistance element illustrated in FIGS. 2A and 2B.

FIG. 3 is a view illustrating a method of operating a variable resistance element illustrated in FIGS. 2A and 2B, namely, a view illustrating a program method. FIG. 3 shows only a portion of the variable resistance element illustrated in FIG. 2A.

Referring to FIG. 3, in an embodiment, the ion supply layer 130 may include $LiCoO_2$, and the ion-receiving layer 120 may include $WO_3$.

When a positive program voltage is applied to the gate pattern 140, the metal cations, that is, $Li^+$ ions, in the ion supply layer 130 may move to the ion-receiving layer 120. The $Li^+$ ions that have moved to the ion-receiving layer 120 may meet electrons supplied from the source pattern 110 and/or the drain pattern 150 and react with $WO_3$ as shown in the following chemical reaction equation 1, thereby forming oxygen vacancies in the ion-receiving layer 120:

$$xLi^+ + xe^- + WO_3 \rightarrow Li_xWO_{3-x}$$  Chemical Reaction Equation 1

For the source pattern 110 and/or the drain pattern 150 to supply electrons, a ground voltage may be applied to at least one of these patterns. As an example, a ground voltage may be applied to the source pattern 110, and the drain pattern 150 may be in a floating state in which no voltage is applied. Alternatively, the source pattern 110 may be in a floating state, and a ground voltage may be applied to the drain pattern 150. Alternatively, a ground voltage may be applied to both the source pattern 110 and the drain pattern 150.

The oxygen vacancies act as donor defects as described above. Thus, when a positive program voltage is applied, the electrical conductivity of the ion-receiving layer 120 may increase, that is, the electrical resistance may decrease.

Here, as the number of the program voltage pulses increases, the amount of $Li^+$ ions moving from the ion supply layer 130 to the ion-receiving layer 120 may gradually increase, and accordingly, the amount of oxygen vacancies in the ion-receiving layer 120 may gradually increase.

As a result, the electrical conductivity of the ion-receiving layer 120 may gradually increase, that is, the electrical resistance may gradually decrease.

In contrast, although not shown in the figures, when a negative erase voltage is applied to the gate pattern 140, $Li^+$ ions may be returned from the ion-receiving layer 120 to the ion supply layer 130, and thus the electrical conductivity of the ion-receiving layer 120 may decrease, that is, the electrical resistance may increase. This decrease in electrical conductivity and/or increase in electrical resistance may be gradual depending on the number of erase voltage pulses. In addition, a positive voltage may be applied to at least one of the source pattern 110 and the drain pattern 150. As an example, a positive voltage may be applied to the source pattern 110, and the drain pattern 150 may be in a floating state. Alternatively, the source pattern 110 may be in a floating state, and a positive voltage may be applied to the drain pattern 150. Alternatively, a positive voltage may be applied to both the source pattern 110 and the drain pattern 150.

As a result, the variable resistance element including the ion-receiving layer 120, the ion supply layer 130 and the gate pattern 140 may be characterized by resistance that gradually changes depending on the amount of ions moving between the ion-receiving layer 120 and the ion supply layer 130, and thus this variable resistance element is suitable for use as a synapse in a neuromorphic device.

The resistance state of this variable resistance element may be read using the source pattern 110 and the drain pattern 150. That is, the resistance state of the variable resistance element may be understood or determined by applying a predetermined read voltage between the source pattern 110 and the drain pattern 150 and reading the current flowing therebetween, that is, the current flowing in the ion-receiving layer 120.

Meanwhile, a plurality of the variable resistance elements may be arranged to form an array. This will be described below by way of examples with reference to FIGS. 4A, 4B and 5.

Figure 4A:
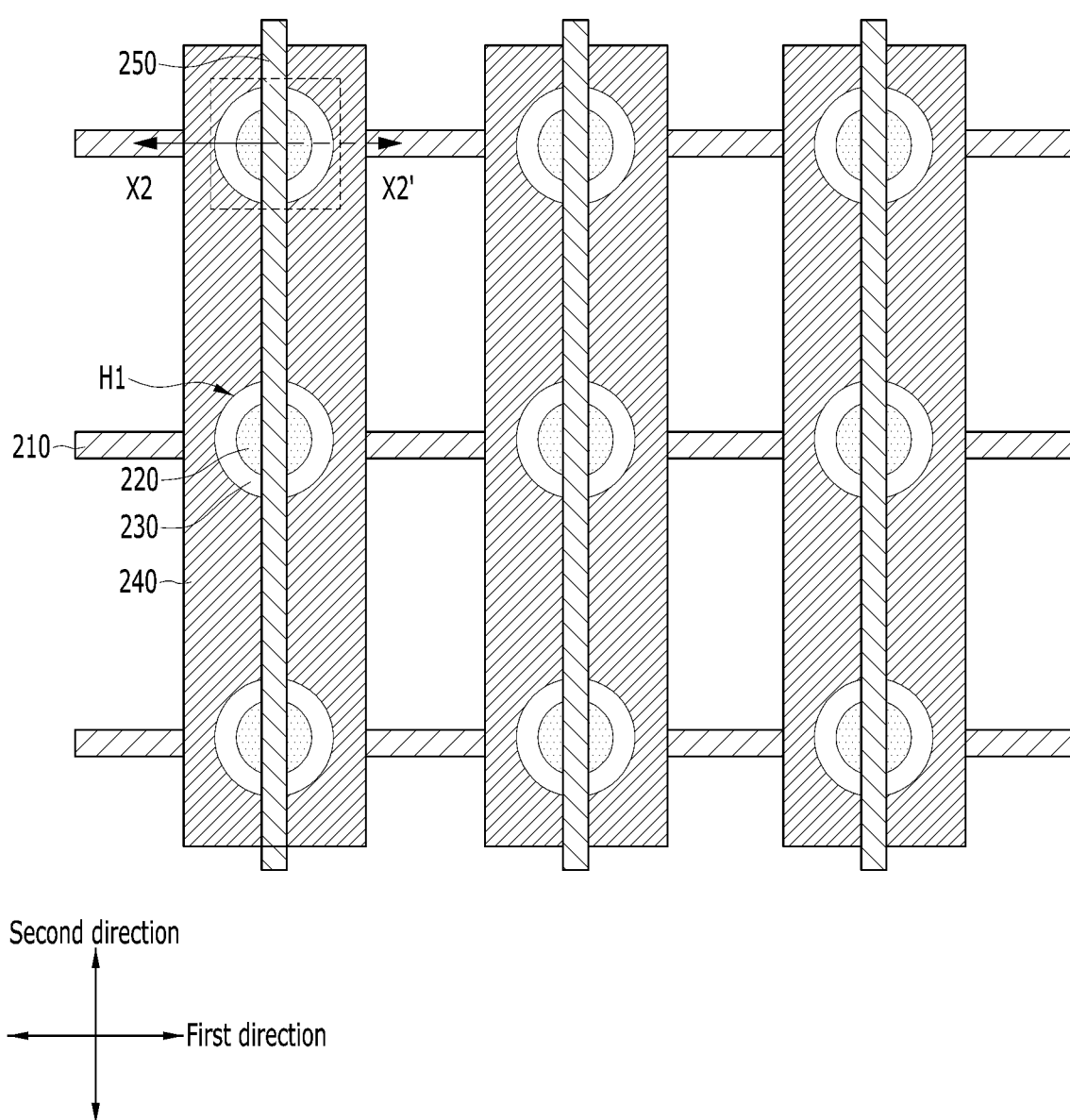
FIGS. 4A and 4B are a plan view and sectional view illustrating a semiconductor device according to an embodiment of the present disclosure.
Figure 4B:
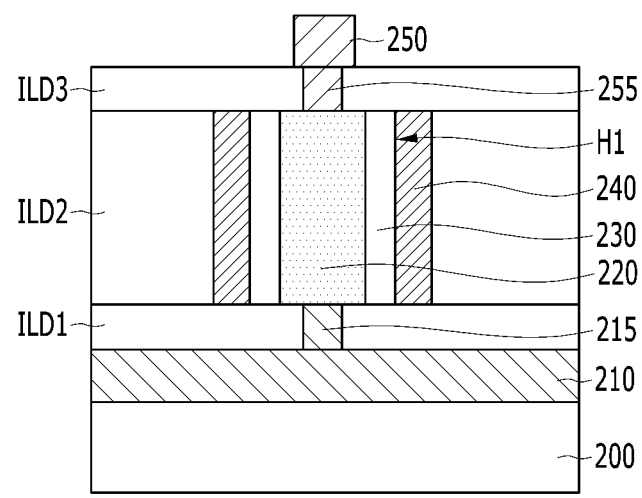

FIGS. 4A and 4B are a plan view and sectional view illustrating a semiconductor device according to an embodiment of the present disclosure. FIG. 4B is a sectional view taken along line X2-X2' of FIG. 4A.

Referring to FIGS. 4A and 4B, a semiconductor device according to an embodiment of the present disclosure may include: a substrate 200; source lines 210 formed on the substrate 200 and extending in a first direction; bit lines 250 extending in a second direction intersecting with the first direction; an ion-receiving layer 220 disposed between the source lines 210 and the bit lines 250, and located at intersections between the source lines 210 and the bit lines 250; an ion supply layer 230 surrounding a sidewall of the ion-receiving layer 220; and word lines 240 surrounding a sidewall of the ion supply layer 230 and extending in the second direction.

The substrate 200 may include certain necessary underlying structures (not shown), such as for example, transistors for controlling the source lines 210, the word lines 240 and/or the bit lines 250.

The plurality of source lines 210 may be arranged to be spaced apart from each other in the second direction, which is at an angle to the first direction, while extending in the first direction on the substrate 200. Although not shown in the figures, an interlayer dielectric layer may fill in a space between the source lines 210. The source line 210 may include various electrically conductive materials such as metals, metal nitrides, or combinations thereof.

On an interlayer dielectric layer (not shown) between the source lines 210 and the ion-receiving layer 220, a pillar-shaped source line contact 215 may be disposed. The source line contact 215 may be disposed at each of intersections between the source lines 210 and the bit lines 250 and may have a pillar-like shape. A space between the source line contacts 215 may be filled with a first interlayer dielectric layer ILD1.

On a first layer including the source line contact 215 and the first interlayer dielectric layer ILD1, the ion-receiving layer 220, the ion supply layer 230 and the word lines 240 may be disposed.

The ion-receiving layer 220 may be disposed at each of intersections between the source lines 210 and the bit lines 250 and may have a pillar shape. A bottom of the ion-receiving layer 220 may be connected to the source line contact 215. The width of the ion-receiving layer 220 in a horizontal direction parallel to the surface of the substrate 200 may be equal to or greater than the width of the source line contact 215 in the same direction. As a result, the source line contact 215 does not unintentionally connect with the ion supply layer 230 and/or the word line 240.

The ion supply layer 230 may completely surround a sidewall of the ion-receiving layer 220. In other embodiments, the ion supply layer 230 may be in contact with a portion of the outer sidewall of the ion-receiving layer 220, as long as the contact area ensures a smooth supply of ions to the ion-receiving layer 220. As used herein, "a portion of the sidewall of the ion-receiving layer 220" may mean a portion of the sidewall in the horizontal direction and/or the vertical direction. That is, the ion supply layer 230 may have a shape which is in contact with a portion of the ion-receiving layer 220 in the horizontal direction and does not surround the ion-receiving layer 220 in the plan view. Alternatively, the ion supply layer 230 may completely surround a sidewall of the ion-receiving layer 220 in a plan view, but only a portion of the ion-receiving layer 220 in the sectional view, i.e., the ion supply layer 230 may have a smaller thickness than the ion-receiving layer 220 in the vertical direction. Alternatively, both may be possible. That is, the ion supply layer 230 may partially contact the ion-receiving layer 220 in the horizontal direction and vertical direction. A sidewall of the ion supply layer 230, which is in contact with the sidewall of the ion-receiving layer 220, will be referred to as an inner sidewall, and the sidewall of the ion supply layer 230 that is located opposite to the inner sidewall of the ion supply layer 230 will be referred to as an outer sidewall.

The word line 240 may completely surround the outer sidewall of the ion supply layer 230. However, in other embodiments, the word line 240 may be in contact with a portion of the outer sidewall of the ion supply layer 230, as long as the contact area is of a magnitude for ensuring a sufficient voltage to the ion supply layer 230. As used herein, "a portion of the outer sidewall of the ion supply layer 230" may mean a portion of the outer sidewall in the horizontal direction and/or the vertical direction. That is, the word line 240 may have a shape which is contact with a portion of the outer sidewall of the ion supply layer 230 in the horizontal direction and does not surround the ion supply layer 230 in the plan view. Alternatively, the word line 240 may be in contact with a portion of the outer sidewall of the ion supply layer 230 in the vertical direction, with a smaller thickness than the thickness of the ion supply layer 230 in the vertical direction, while surrounding the outer sidewall of the ion supply layer 230 in the plan view. Alternatively, both may be possible. That is, the word line 240 may partially contact the ion supply layer 230 in the horizontal direction and the vertical direction. In addition, the word line 240 may be formed to extend in the second direction and surround the plurality of ion supply layers 230 which are arranged in the second direction. However, the direction in which the word line 240 extends may be variable. For example, word line 240 may extend in a direction and is connected to the plurality of ion supply layers 230 that are arranged in the same direction. For example, the word line 240 may extend in the first direction and surround the plurality of ion supply layer 230 that are arranged in the first direction.

Referring back to FIG. 4B, a space between the ion-receiving layer 220, the ion supply layer 230 and the word line 240 may be filled with a second interlayer dielectric layer ILD2.

The ion-receiving layer 220, the ion supply layer 230, the word line 240 and the second interlayer dielectric layer ILD2 may be included in a second layer. The bit line contact 255 may be disposed at each intersection between the source line 210 and the bit line 250, and may have a pillar or pillar-like shape. A bottom of the bit line contact 255 may be connected to a top of the ion-receiving layer 220. The width of the ion-receiving layer 220 in a horizontal direction parallel to the surface of the substrate 200 may be equal to or greater than the width of the bit line contact 255 in the same direction. A space between the bit line contact 255 will may be filled with a third interlayer dielectric layer ILD3.

The bit line contact 255 and the third interlayer dielectric layer ILD3 may form a third layer on which bit lines 250 may be disposed, and arranged to be spaced from each other in the first direction while extending in the second direction.

In a semiconductor device of an embodiment described above, a variable resistance element may be formed at each of the intersections (see the dotted line in FIG. 4A) between the source lines 210 and the bit lines 250. This variable resistance element may be substantially the same as the above-described variable resistance element shown in FIGS. 2A and 2B. In other words, the source line 210, the source line contact 215, the ion-receiving layer 220, the ion supply layer 230, the word line 240, the bit line contact 255 and the bit line 250, which are included in the dotted line region of FIG. 4A, may respectively correspond to the source pattern 110, the source contact 115, the ion-receiving layer 120, the ion supply layer 130, the gate pattern 140, the drain contact 155 and the drain pattern 150, which are shown in FIGS. 2A and 2B. Accordingly, each variable resistance element in the semiconductor device of this embodiment may operate in the same manner as described above with reference to FIG. 3, as an example.

A method of fabricating the semiconductor device of an embodiment will be described below by way of example.

First, a conductive material may be formed on a substrate 200 and patterned to form source lines 210. Then, a dielectric material covering the source lines 210 may be deposited and a planarization process may be performed until the upper surfaces of the source lines 210 are exposed, thereby forming an interlayer dielectric layer (not shown) filling a space between the source lines 210. Next, a first interlayer dielectric layer ILD1 covering the source lines 210 and the interlayer dielectric layer therebetween may be formed, and then the first interlayer dielectric layer ILD1 may be selectively etched to provide spaces in which a source line contact 215 is to be formed. The spaces may be filled with a conductive material to form the source line contacts 215. Then, a conductive material may be formed on the first interlayer dielectric layer ILD1 and the source line contacts 215 and patterned to form word lines 240, and a second interlayer dielectric layer ILD2 filling the space between the word lines 240 may be formed. Then, the word lines 240 may be selectively etched to form, in the word lines 240, holes H1 which provide spaces in which an ion-receiving layer 220 and an ion supply layer 230 are to be formed. The hole H1 may be formed to have a larger width than that of each source line contact 215 while exposing each of the source line contacts 215. Next, a material layer for forming the ion supply layer 230 may be formed along the sidewalls and bottom surfaces of the holes H1 up to a thickness that does not completely fill the holes H1, and then the material layer may be blanket-etched to form the ion supply layer 230 on the sidewalls of the holes H1. By this blanket etching, the bottom surface of the hole H1 may be exposed. The thickness and extent of blanket etching of the material layer may be adjusted such that the width of the exposed bottom surface of the hole H1 is equal to or larger than the width of the source line contact 215. Next, an ion-receiving layer 220 may be formed, which fills the remaining space of the hole H1 having the ion supply layer 230 formed therein. Next, a third interlayer dielectric layer IDL3 may be formed over the ion-receiving layer 220, the ion supply layer 230, the word lines 240 and the second interlayer dielectric layer ILD2, and then the third interlayer dielectric layer ILD3 may be selectively etched to provide spaces in which bit line contacts 255 are to be formed, and the spaces may be filled with a conductive material to form the bit line contacts 255. Thereafter, a conductive material may be formed over the bit line contacts 255 and the third interlayer dielectric layer ILD3 and patterned to form bit lines 250.

Figure 5:
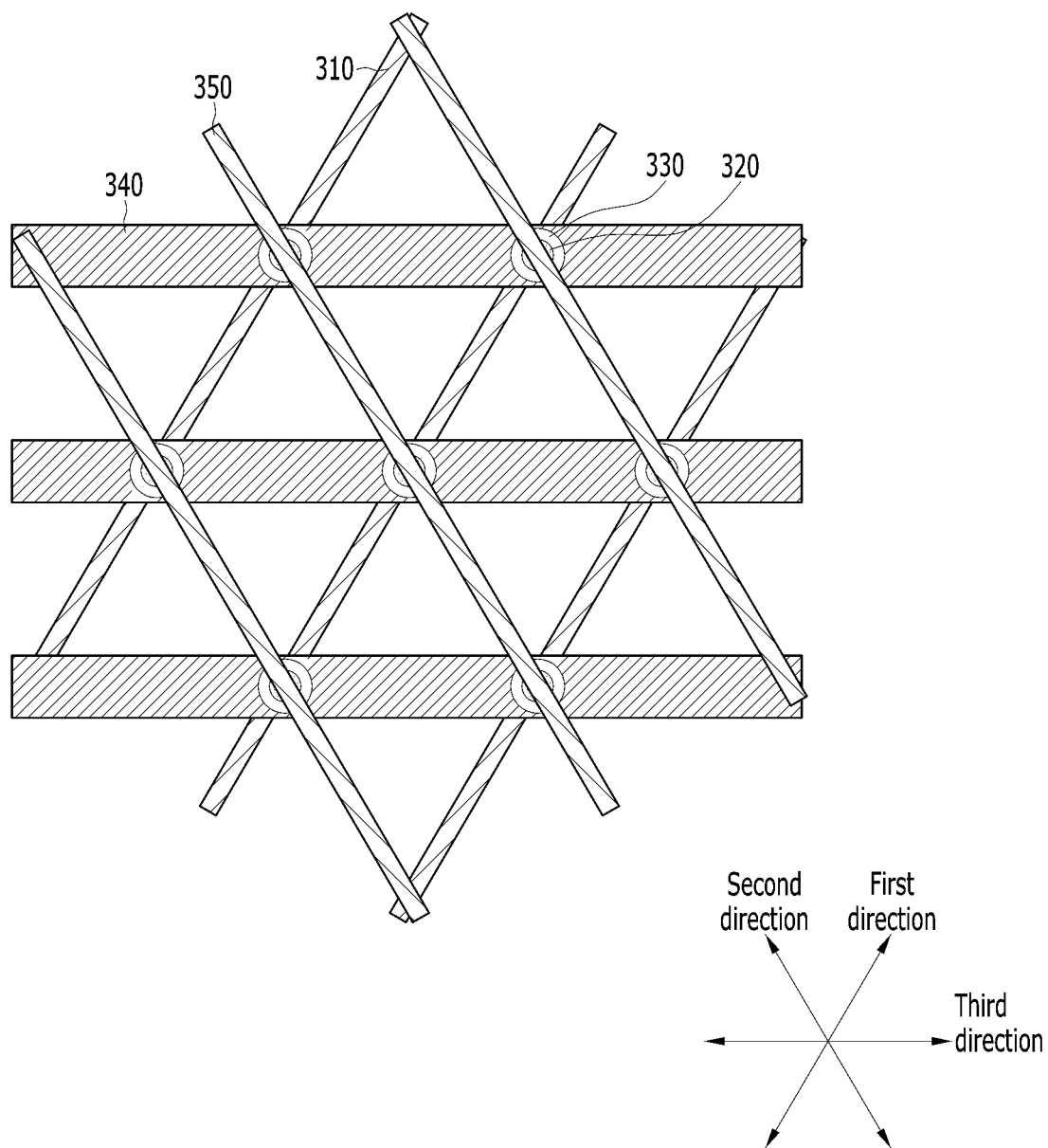
FIG. 5 is a plan view illustrating a semiconductor device according to another embodiment of the present disclosure.

FIG. 5 is a plan view illustrating a semiconductor device according to another embodiment of the present disclosure. This embodiment will be described with a focus on differences from the embodiment described above with reference to FIGS. 4A and 4B.

Referring to FIG. 5, a semiconductor device of this embodiment may include: source lines 310 extending in a first direction; bit lines 350 extending in a second direction intersecting with the first direction; an ion-receiving layer 320 disposed between the source lines 310 and the bit lines 350 and located at intersections between the source lines 310 and the bit lines 350; an ion supply layer 330 surrounding a sidewall of the ion-receiving layer 320; and word lines 340 extending in a third direction and surrounding a sidewall of the ion supply layer 330.

This embodiment may be substantially the same as the above-described embodiment, except for the directions in which the source line 310, the bit line 350 and the word line 340 extend.

The source line 310, the bit line 350 and the word line 340 extend in directions that intersect with one another at angles that need not be perpendicular. In FIG. 5, an area having a substantially triangular shape is defined by the source line 310, the bit line 350 and the word line 340. As an example, the angle formed by the source line 310 and the bit line 350 may be about 60°, the angle formed by the bit line 350 and the word line 340 may be about 60°, and the angle formed by the word line 340 and the source line 310 may be about 60°. In this example, an area defined by the source line 310, the bit line 350, and the word line 340 has an equilateral triangle shape.

The ion-receiving layer 320 and the ion supply layer 330 may be disposed at each intersection of the source lines 310, the bit lines 350 and the word lines 340. As a result, a variable resistance element may be formed at each intersection of the source lines 310, the bit lines 350 and the word lines 340.

According to this embodiment, the degree of integration of the semiconductor device can be further increased as compared to embodiments described with reference to FIGS. 4A and 4B.

Figure 6A:
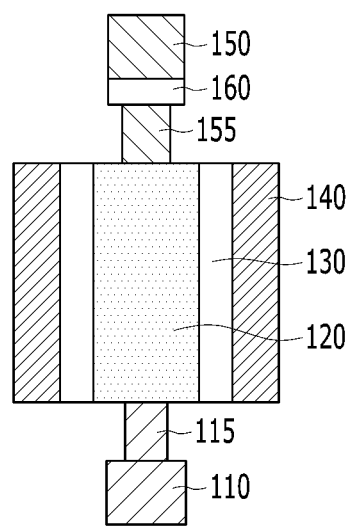
FIG. 6A is a sectional view illustrating a variable resistance element according to another embodiment of the present disclosure.
Figure 6B:
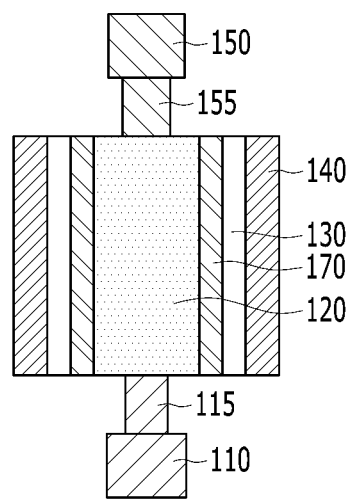
FIG. 6B is a sectional view illustrating a variable resistance element according to still another embodiment of the present disclosure.

FIG. 6A is a sectional view illustrating a variable resistance element according to another embodiment of the present disclosure, and FIG. 6B is a sectional view illustrating a variable resistance element according to still another embodiment of the present disclosure. These embodiments will be described with a focus on differences from the embodiment described above with reference to FIGS. 2A and 2B.

Referring to FIG. 6A, a variable resistance element of an embodiment may further include a selection element pattern 160 in addition to the components of the variable resistance element shown in FIGS. 2A and 2B.

Although FIG. 6A illustrates the selection element pattern 160 interposed between a drain pattern 150 and a drain contact 155, the present disclosure is not limited thereto. The selection element pattern 160 may be positioned between the drain pattern 150 and the ion-receiving layer 120, and/or between the source pattern 110 and the ion receiving layer 120. The selection element pattern 160 may control access from the drain pattern 150 to the ion-receiving layer 120 or from the source pattern 110 to the ion-receiving layer 120. For example, the selection element pattern 160 may be interposed between the drain contact 155 and the ion-receiving layer 120, between the source pattern 110 and the source contact 115, and/or between the source contact 115 and the ion-receiving layer 120.

In addition, although FIG. 6A illustrates a selection element pattern 160 that has the same shape as the drain pattern 150, the present disclosure is not limited thereto, and the selection element pattern 160 may have various shapes. For example, the selection element pattern 160 may have the same outline, outer contour or island-like shape as the drain contact 155 and/or the source contact 115 when viewed in the plan view. Alternatively, or additionally, the selection element pattern 160 may also have the same shape as the source pattern 110. In other embodiments, the selection element pattern 160 may also have a line shape that overlaps with the bit line or the source line when viewed in the plan view.

The selection element pattern 160 may have a selection element characteristic in that when the magnitude of the voltage or current applied thereto is equal to or lower than a certain critical value, the selection element pattern 160 passes little or no current therethrough, and when the magnitude of the voltage or current applied thereto is higher than a certain critical value, the selection element pattern 160 passes a current that rapidly increases in proportion to the magnitude of the applied voltage or current. Selection element pattern 160 may include, for example, an MIT (Metal Insulator Transition) element such as $NbO_2$ or $TiO_2$, an MIEC (Mixed Ion-Electron Conducting) element such as $ZrO_2(Y_2O_3)$, $Bi_2O_3$—BaO or $(La_2O_3)x(CeO_2)1$-x, an OTS (Ovonic Threshold Switching) element including a chalcogenide-based material such as $Ge_2Sb_2Te_5$, $As_2Te_3$, $As_2$ or $As_2Se_3$, a rectifying element such as a diode, or a tunneling dielectric layer, which is composed of various dielectric materials such as silicon oxides, silicon nitrides or metal oxides. The tunneling dielectric layer may have a small or minimal thickness to permit electron tunneling at a certain voltage or current.

The selection element pattern 160 may have either a monolayer structure or a multilayer structure, which is composed of a combination of two or more layers and exhibits selection element characteristics.

When the selection element pattern 160 is used in the variable resistance element, it may reduce and/or block leakage current between adjacent variable resistance elements that are disposed in an array structure such as those illustrated in FIGS. 4A, 4B and 5.

Referring to FIG. 6B, a variable resistance element of an embodiment may further include, in addition to the components of the variable resistance element shown in FIGS. 2A and 2B, an isolation layer interposed between the ion-receiving layer 120 and the ion supply layer 130 to physically isolate them from each other.

The isolation layer 170 may function to prevent a mixed layer from being unnecessarily formed due to ion movement at the interface between the ion-receiving layer 120 and the ion supply layer 130. In addition, the isolation layer 170 may permit the movement of metal ions when an operating voltage such as a program voltage or an erase voltage is applied to the gate pattern 140. On the other hand, the isolation layer 170 may block electron movement at other voltages. An electrolyte material may be used in the isolation layer 170.

When the isolation layer 170 is used, it may efficiently control metal ion movement between the ion supply layer 130 and the ion-receiving layer 120, and may prevent a mixed layer from being formed between the ion supply layer 130 and the ion-receiving layer 120. The isolation layer 170 thus contributes to the reliability of the variable resistance element.

Figure 7:
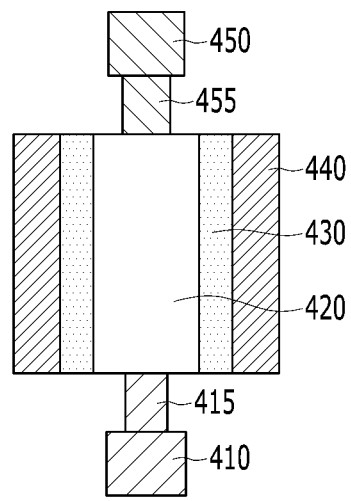
FIG. 7 is a sectional view illustrating a variable resistance element according to yet another embodiment of the present disclosure.

FIG. 7 is a sectional view illustrating a variable resistance element according to yet another embodiment of the present disclosure.

Referring to FIG. 7, the variable resistance element of an embodiment may include: a pillar-shaped ion supply layer 420 extending in a vertical direction; an ion-receiving layer 430 surrounding a sidewall of the ion supply layer 420; a gate pattern 440 surrounding a sidewall of the ion-receiving layer 430; a source pattern 410 connected to a bottom of the ion supply layer 420; and a drain pattern 450 connected to a top of the ion supply layer 420. A source contact 415 may be interposed between the source pattern 410 and the ion supply layer 420, and a drain contact 455 may be interposed between the drain pattern 450 and the ion supply layer 420.

An embodiment illustrated in FIG. 7 differs from an embodiment shown in FIGS. 2A and 2B in the position of the ion supply layer and the ion-receiving layer in the different embodiments. An embodiment shown in FIGS. 2A and 2B illustrates a variable resistance element in which the ion supply layer 130 surrounds the outer sidewall of the pillar-shaped ion-receiving layer 120, but FIG. 7 shows a variable resistance element in which the ion-receiving layer 430 surrounds an outer sidewall of a pillar-shaped ion supply layer 420. Although only the positions of the ion-receiving layers and the ion supply layers are reversed in the different embodiments, the material forming the ion supply layer 420 may be the same as the material forming the ion supply layer 130, and the material forming the ion-receiving layer 430 may be the same as the material forming the ion-receiving layer 120.

In this embodiment, the ion supply layer 420 may develop a metal ion deficient state by supplying cations, particularly metal cations, to the ion-receiving layer 430, thus forming holes. The holes in the ion supply layer 420 act as acceptor defects. Thus, as the amount of the holes increases, the electrical conductivity of the ion supply layer 420 may increase, and as the amount of the holes decreases, the electrical conductivity of the ion supply layer 420 may decrease. That is, the resistance of the ion supply layer 420 may be variable depending on the amount of holes in the ion supply layer 420. Accordingly, in the variable resistance element according to embodiments shown in FIGS. 2A and 2B, the ion-receiving layer 120 functions as a resistance change element, but in the present embodiment, the ion supply layer 420 may function as a resistance change element.

The ion-receiving layer 430 may receive cations, particularly metal cations, from the ion supply layer 420. In this embodiment, the ion-receiving layer 430 may have a shape that surrounds an outer sidewall of the ion supply layer 420. However, the present disclosure is not limited thereto, and the shape of the ion-receiving layer 430 may be variously modified so that the ion-receiving layer 430 is in contact with at least a portion of the sidewall of the ion supply layer 420 to provide a smooth or uninterrupted ion supply from the ion supply layer 420 to the ion-receiving layer 430.

The gate pattern 440 may function to control ion movement from the ion supply layer 420 to the ion-receiving layer 430 in response to receiving a predetermined voltage. The gate pattern 440 may have a shape that surrounds an outer sidewall of the ion-receiving layer 430. However, the present disclosure is not limited thereto, and in other embodiments, the shape of the gate pattern 440 may be variously modified so that gate pattern 440 is in contact with at least a portion of the outer sidewall of the ion-receiving layer 430, and ion movement from the ion supply layer 420 o the ion-receiving layer 430 is smooth and uninterrupted.

The source pattern 410 and the drain pattern 450 may be connected to the bottom and top of the ion supply layer 420, respectively, and a change in the resistance of the ion supply layer 420 may be read through these patterns.

A method of operating the variable resistance element shown in FIG. 7 will be described in detail below with reference to FIG. 8.

Figure 8:
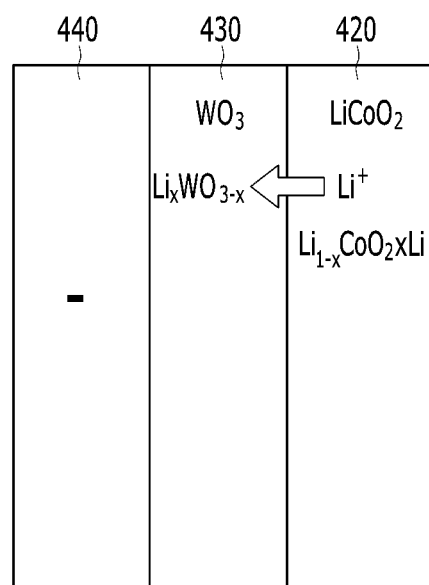
FIG. 8 is a view illustrating a method of operating the variable resistance element of FIG. 7.

FIG. 8 is a view illustrating a method of operating the variable resistance element shown in FIG. 7, particularly a program method. FIG. 8 shows only a portion of the variable resistance element shown in FIG. 7.

Referring to FIG. 8, the ion supply layer 420 may include $LiCoO_2$, and the ion-receiving layer 430 may include $WO_3$.

When a negative program voltage is applied to the gate pattern 440, the metal cations, that is, $Li^+$ ions, in the ion supply layer 420 may move to the ion-receiving layer 430.

When Li+ ions are released from the ion supply layer 420, holes may be formed in the ion supply layer 420 as shown in the following chemical reaction equation 2:

$$LiCoO_2 \rightarrow Li_{1-x}CoO_2 + xLi^+ + xh \quad \text{Chemical Reaction Equation 2}$$

In this case, a ground voltage may be applied to at least one of the source pattern 410 and the drain pattern 450. As an example, a ground voltage may be applied to the source pattern 410, and the drain pattern 450 may be in a floating state. Alternatively, the source pattern 410 may be in a floating state, and a ground voltage may be applied to the drain pattern 450. Alternatively, a ground voltage may be applied to both the source pattern 410 and the drain pattern 450.

As described above, the holes act as acceptor defects. Thus, when a negative program voltage is applied, the electrical conductivity of the ion supply layer 420 may increase, that is, the electrical resistance may decrease.

Here, as the number of the program voltage pulses increases, the amount of Li+ ions moving from the ion supply layer 420 to the ion-receiving layer 430 may gradually increase, and accordingly, the amount of holes in the ion supply layer 420 may gradually increase.

As a result, the electrical conductivity of the ion supply layer 420 may gradually increase, that is, the electrical resistance may gradually decrease.

In contrast, although not shown in the figures, when a positive erase voltage is applied to the gate pattern 440, Li+ ions may be returned from the ion-receiving layer 430 to the ion supply layer 420, and thus the electrical conductivity of the ion supply layer 420 may decrease, that is, the electrical resistance may increase. This decrease in electrical conductivity and/or increase in electrical resistance may be gradual depending on the number of erase voltage pulses. In addition, a negative voltage may be applied to at least one of the source pattern 410 and the drain pattern 450. As an example, a negative voltage may be applied to the source pattern 410, and the drain pattern 450 may be in a floating state. Alternatively, the source pattern 410 may be in a floating state, and a negative voltage may be applied to the drain pattern 450. Alternatively, a negative voltage may be applied to both the source pattern 410 and the drain pattern 450.

As a result, the variable resistance element including the ion supply layer 420, the ion-receiving layer 430 and the gate pattern 440 may be characterized by resistance that gradually changes depending on the amount of ions moving between the ion supply layer 420 and the ion-receiving layer 430, and thus this variable resistance element is suitable for use as a synapse in a neuromorphic device. In the above-described embodiment, the change in resistance of the variable resistance element through changes in oxygen vacancies in a layer is possible, but the present embodiment differs from the above-described embodiment in that the change in resistance of the variable resistance element results from changes in the numbers of holes.

This resistance state of the variable resistance element may be read using the source pattern 410 and the drain pattern 450. That is, the resistance state of the variable resistance element may be understood or determined by reading the current or voltage difference between the source pattern 410 and the drain pattern 450.

Meanwhile, it is to be understood that the variable resistance element of the present embodiment may be used in the above-described semiconductor devices shown in FIGS. 4A, 4B and 5, or may further include a selection element pattern, similar to the variable resistance element shown in FIG. 6A, and/or may further include an isolation layer, similar to the variable resistance element shown in FIG. 6B.

Figure 9:
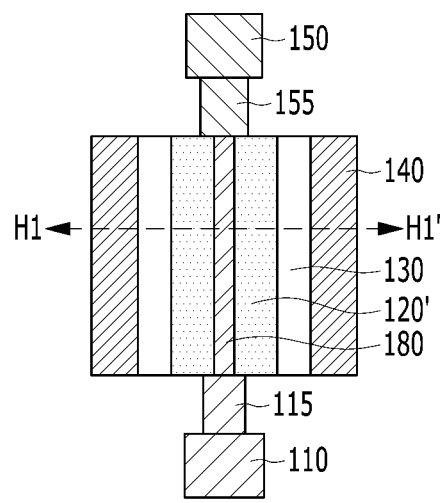
FIG. 9 is a sectional view illustrating a variable resistance element according to still yet another embodiment of the present disclosure.

FIG. 9 is a sectional view illustrating a variable resistance element according to still yet another embodiment of the present disclosure. This embodiment will be described with a focus on differences from the embodiment shown in FIGS. 2A and 2B.

Referring to FIG. 9, an ion-receiving layer 120' of a variable resistance element according to an embodiment may have a hollow pillar shape, for example, a cylinder-like shape, unlike the ion-receiving layer 120 of the variable resistance element shown in FIGS. 2A and 2B, which has a solid pillar shape. The space in the ion-receiving layer 120' may be filled with a dielectric pattern 180. In other words, a pillar-shaped dielectric pattern 180 may be further formed, and the ion-receiving layer 120' may have a shape surrounding the dielectric pattern 180.

The ion-receiving layer 120' needs to be electrically connected to the source pattern 110 and the drain pattern 150. Thus, a portion of a bottom of the ion-receiving layer 120' may be in contact with the source contact 115 (or the source pattern 110 if the source contact 115 is omitted), and a portion of a top of the ion-receiving layer 120' may be in contact with the drain contact 155 (or the drain pattern 150 if the drain contact 155 is omitted). In addition, the width of the dielectric pattern 180 in the horizontal direction may be smaller than the width of each of the source contact 115 (or the source pattern 110 if the source contact 115 is omitted) and the drain contact 155 (or the drain pattern 150 if the drain contact 155 is omitted).

According to this embodiment, the overall width of the ion-receiving layer 120' in the horizontal direction may be decreased because of the inclusion of dielectric pattern 180. Consequently, the path of metal ion movement may be shortened in the horizontal direction, and hence the rate of oxygen vacancy formation in the ion-receiving layer 120' may increase. As a result, the rate of change in resistance of the ion-receiving layer 120' may increase, and thus the operating speed of the variable resistance element may also increase.

Similarly, although not shown in the figures, the shape of the ion supply layer 420 in the variable resistance element shown in FIG. 7 may be modified into a hollow pillar shape, and the empty space of the ion supply layer 420 may be filled with a dielectric material. Such an embodiment also supports an increased operating speed.

The variable resistance element and/or semiconductor device according to each of the above-described embodiments may be used in various devices or systems, for example, a neuromorphic device. This will be described by way of example with reference to FIG. 10.

Figure 10:
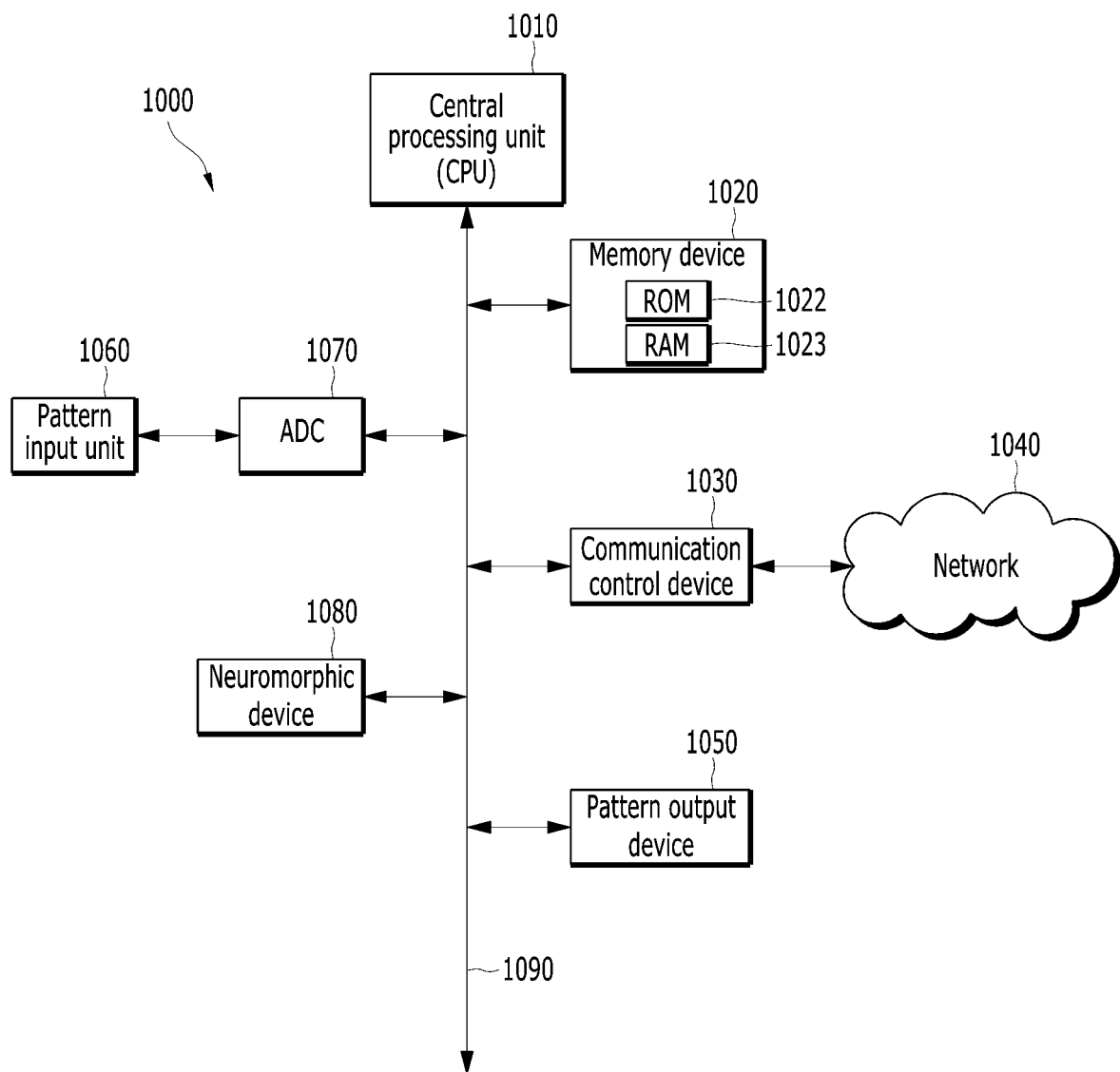
FIG. 10 illustrates an example of a pattern recognition system according to an embodiment of the present disclosure.

FIG. 10 shows an example of a pattern recognition system 1000 according to an embodiment of the present disclosure. The pattern recognition system according to this embodiment may be a system for recognizing various patterns, such as a speech recognition system or an image recognition system. The pattern recognition system according to this embodiment may be configured to have a neuromorphic device including embodiments of variable resistance elements and/or semiconductor devices described above.

Referring to FIG. 10, the pattern recognition system 1000 according to this embodiment may include a central processing unit (CPU) 1010, a memory device 1020, a communication control device 1030, a network 1040, a pattern output device 1050, a pattern input device 1060, an analog-digital converter (ADC) 1070, a neuromorphic device 1080, a bus line 1090, and the like.

The central processing unit 1010 may generate and transmit various signals used in a learning operation of the neuromorphic device 1080, and may perform various processing operations and functions for recognizing patterns of sound, images or the like based on an output from the neuromorphic device 1080. This central processing unit 1010 may be connected, via the bus line 1090, to the memory device 1020, the communication control device 1030, the pattern output device 1050, the analog-digital converter (ADC) 1070, and the neuromorphic device 1080.

The memory device 1020 may store various information required for the pattern recognition system 1000. To this end, the memory device 1020 may include different kinds of memory devices. For example, the memory device 1020 may include a ROM device 1022, a RAM device 1023, and the like. The ROM device 1022 may function to store various programs or data, which are used in the central processing unit 1010 in order to perform the learning operation of the neuromorphic device 1080, pattern recognition, etc. The RAM device 1023 may store the program or data downloaded from the ROM device 1022, or store data, such as sound or images, which were converted and analyzed by the analog-digital converter (ADC) 1070.

The communication control device 1030 may exchange recognized data (e.g., sound or images) with other communication control devices through the network 1040.

The pattern output device 1050 may output the recognized data (e.g., sound or images) in various manners. For example, the pattern output device 1050 may include a printer, a display unit, and the like, and may output sound waveforms or display images.

The pattern input device 1060 may receive analog-type sound, images, etc., and may include a microphone, a camera, etc.

The analog-digital converter (ADC) 1070 may convert analog data, provided by the pattern input device 1060, to digital data, and may also analyze the digital data.

The neuromorphic device 1080 may perform learning, recognition, and the like using data provided by the analog-digital converter (ADC) 1070, and may output data corresponding to recognized patterns. The neuromorphic device 1080 may include one or more of the variable resistance elements and semiconductor devices according to the above-described embodiments. For example, the neuromorphic device 1080 may include a plurality of synapses, and each of the plurality of synapses may include: an ion-receiving layer having a top, a bottom and a sidewall connecting the top and the bottom; an ion supply layer having an inner sidewall connected to at least a portion of an outer sidewall of the ion-receiving layer; a gate pattern connected to an outer sidewall of the ion supply layer; and a source pattern connected to one of the top or bottom of the ion-receiving layer, and a drain pattern connected to the other one of the top or bottom of the ion-receiving layer, wherein a resistance of the ion-receiving layer varies depending on an amount of ions supplied from the ion supply layer based on a voltage applied to the gate pattern. Through this configuration, the symmetry and linearity of synapses may be ensured. Accordingly, the operating characteristics of the neuromorphic device 1080 may be improved, and thus operating characteristics of the pattern recognition system 1000 may also be improved.

In addition, the pattern recognition system 1000 may further include other components required for properly performing its function. For example, it may further include a keyboard, a mouse and the like, as input units for receiving various parameters or setting conditions for operations of the pattern recognition system 1000.

According to the embodiments described above, it is possible to provide a variable resistance element having characteristics suitable for use as a synapse in a neuromorphic device, and a semiconductor device including the same.

Although various embodiments have been described for illustrative purposes, it will be apparent to those skilled in the art that various changes and modifications may be made without departing from the spirit and scope of the disclosure as defined in the following claims.

What is claimed is:

1. A semiconductor device comprising at least one variable resistance element, the variable resistance element comprising:
   an ion supply layer having a top, a bottom and a sidewall connecting the top to the bottom;
   an ion-receiving layer having an inner sidewall connected to at least a portion of the sidewall of the ion supply layer;
   a gate pattern connected to an outer sidewall of the ion-receiving layer; and
   a source pattern connected to one of the top or bottom of the ion supply layer, and a drain pattern connected to the other one or the top or bottom of the ion supply layer,
   wherein a resistance of the ion supply layer is varies depending on an amount of ions supplied from the ion supply layer to the ion-receiving layer in response to a voltage applied to the gate pattern.

2. The semiconductor device of claim 1, wherein a resistance state of the ion supply layer is read using a current or voltage difference applied between the source pattern and the drain pattern.

3. The semiconductor device of claim 1, wherein the ion supply layer comprises a material that supplies metal cations to the ion-receiving layer, which forms holes therein.

4. The semiconductor device of claim 3, wherein a negative voltage is applied to the gate pattern when the metal cations are supplied from the ion supply layer to the ion-receiving layer.

5. The semiconductor device of claim 1, wherein the amount of the ions that are supplied from the ion supply layer to the ion-receiving layer gradually increases with an increasing number of pulses of the voltage applied to the gate pattern.

6. The semiconductor device of claim 1, wherein the ion supply layer has a pillar shape, the inner sidewall of the ion-receiving layer surrounds the sidewall of the ion supply layer, and the gate pattern surrounds the outer sidewall of the ion-receiving layer.

7. The semiconductor device of claim 1, wherein the ion supply layer has a hollow pillar shape, the ion-receiving layer surrounds an outer sidewall of the ion supply layer, the gate pattern surrounds the outer sidewall of the ion-receiving layer, and the variable resistance element further comprises a dielectric pattern that fills the ion supply layer.

8. The semiconductor device of claim 1, further comprising a selection element layer positioned between the ion supply layer and the drain pattern, between the ion supply layer and the source pattern, or between both.

9. The semiconductor device of claim 1, further comprising an isolation layer disposed between the ion-receiving layer and the ion supply layer, wherein the isolation layer permits movement of the ions between the ion supply layer and the ion-receiving layer when the voltage is applied to the gate pattern.

10. The semiconductor device of claim 9, wherein the isolation layer comprises an electrolyte material.

11. The semiconductor device of claim 1, further comprising:
- a plurality of source lines extending in a first direction and connected to the source pattern;
- a plurality of bit lines extending in a second direction, which intersects with the first direction, and connected to the drain pattern; and
- a plurality of word lines extending in one direction and connected to the gate pattern,
- wherein the variable resistance element is disposed at each of intersections between the source lines, the bit lines and the word lines.

12. The semiconductor device of claim 11, wherein the word lines extend in the first direction or the second direction.

13. The semiconductor device of claim 11, wherein the word lines extend in a third direction different from the first direction and the second direction.

14. The semiconductor device of claim 13, wherein an angle formed between the first direction and the second direction, an angle formed between the second direction and the third direction, and an angle formed between the third direction and the first direction are each 60°, and the ion supply layer is located at each vertex of an equilateral triangle defined by the source line, the bit line and the word line.

* * * * *